(12) United States Patent
Liu et al.

(10) Patent No.: US 11,379,007 B2
(45) Date of Patent: Jul. 5, 2022

(54) TRASPRANT DISPLAY DEVICE

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Eddy Liu, New Taipei (TW); Jun-Kang Fang, Zhengzhou (CN); Wei Wu, Zhengzhou (CN); Bin Wang, Zhengzhou (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

(*) Notice: Subject to any disclaimer, the term of this patent is extended or adjusted under 35 U.S.C. 154(b) by 313 days.

(21) Appl. No.: 16/729,091

(22) Filed: Dec. 27, 2019

(65) Prior Publication Data

US 2021/0116967 A1   Apr. 22, 2021

(30) Foreign Application Priority Data

Oct. 16, 2019  (CN) .......................... 201921741212.X

(51) Int. Cl.
| | |
|---|---|
| *G06F 1/16* | (2006.01) |
| *H01L 33/24* | (2010.01) |
| *H01L 25/075* | (2006.01) |
| *H05K 1/18* | (2006.01) |

(52) U.S. Cl.
CPC ........ *G06F 1/1652* (2013.01); *H01L 25/0753* (2013.01); *H01L 33/24* (2013.01); *H05K 1/189* (2013.01); *H05K 2201/10106* (2013.01)

(58) Field of Classification Search
CPC ... G06F 1/1652; H01L 25/0753; H01L 33/24; H05K 1/189
See application file for complete search history.

(56) References Cited

U.S. PATENT DOCUMENTS

| | | | |
|---|---|---|---|
| 6,528,900 B1* | 3/2003 | Serizawa ............ | B60R 16/0207 307/10.1 |
| 10,655,804 B1* | 5/2020 | Yuan ..................... | F21V 23/002 |
| 10,880,996 B2* | 12/2020 | Schaffarz ............. | F21V 19/005 |
| 2005/0207156 A1* | 9/2005 | Wang ...................... | F21K 9/00 362/240 |
| 2008/0129204 A1* | 6/2008 | Tsukamoto ........... | H05K 1/148 315/77 |
| 2010/0255705 A1* | 10/2010 | Higuchi ................ | H01R 12/88 439/329 |

(Continued)

*Primary Examiner* — Fred Tzeng
(74) *Attorney, Agent, or Firm* — ScienBiziP, P.C.

(57) ABSTRACT

A transparent display device includes a flexible circuit board, a plurality of lamps, and a plurality of IC components. The flexible circuit board includes lamp fixing portions, a first bending portion, and second bending portions. The lamp fixing portions are spaced apart from each other and arranged in X-axis columns. Each lamp fixing portion extends as a strip along a Y axis. The X axis is perpendicular to the Y axis. Each lamp fixing portion includes an X-axis end edge and a Y-axis side edge. The first bending portion is bent from the end edge of each lamp fixing portion. Each second bending portion is bent from the side edge of one lamp fixing portion.

17 Claims, 4 Drawing Sheets

(56) References Cited

U.S. PATENT DOCUMENTS

| | | | |
|---|---|---|---|
| 2015/0055355 A1* | 2/2015 | Huang | F21K 9/27 362/382 |
| 2015/0117001 A1* | 4/2015 | Fan | F21V 21/14 362/235 |
| 2016/0234940 A1* | 8/2016 | Shaytan | F21S 4/26 |
| 2019/0206304 A1* | 7/2019 | Fan | H05K 1/189 |

* cited by examiner

TRASPRANT DISPLAY DEVICE

FIELD

The subject matter herein generally relates to a transparent display device.

BACKGROUND

Transparent display devices have complicated processing and high processing costs although they are widely used in many environments. A conventional transparent display device includes a plurality of light bars composed of a plurality of light emitting diodes (LEDs), and two ends of each light bar are fixed to a light bar fixing board. Each light bar includes a circuit board, lamps on the circuit board, and a pin header on a side of the circuit board. The pin header is connected to a female header on the light bar fixing board to transfer signals and power. The transparent display device also includes a signal adapter board that is connected to the light bar fixing board. The signal adapter board is provided with a plurality of ICs and a pin header connected to another female header on the light bar fixing board. Thus, there are many connectors in the transparent display device, which have high costs and complicated processes.

SUMMARY

According to one aspect of the present disclosure, a transparent display device is provided. The display device includes a flexible circuit board, a plurality of lamps, and a plurality of integrated circuit (IC) components. The flexible circuit board includes a plurality of lamp fixing portions, a first bending portion coupling to the plurality of lamp fixing portions, and a plurality of second bending portions each coupling to a corresponding one lamp fixing portion. The lamps are on the lamp fixing portions. The plurality of integrated circuit (IC) components is on the first bending portion and the second bending portions. Each lamp fixing portion extends as a strip along a Y axis. The lamp fixing portions are spaced apart from each other and arranged in a column along an X axis that is perpendicular to the Y axis. Each lamp fixing portion includes an end edge along the X axis and a side edge along the Y axis. The end edge is coupled to the side edge. The first bending portion is bent from the end edge of each of the plurality of lamp fixing portions. Each second bending portion is bent from the side edge of one of the lamp fixing portions.

According to another aspect of the present disclosure, a transparent display device is provided. The display device includes a flexible circuit board, a plurality of lamps, and a plurality of integrated circuit (IC) components. The flexible circuit board includes a plurality of lamp fixing portions, a first bending portion coupling to the plurality of lamp fixing portions, and a plurality of second bending portions each coupling to a corresponding one lamp fixing portion. The lamps are on the lamp fixing portions. The lamps are spaced apart from each other and arranged in an array. The integrated circuit (IC) components are on the first bending portion and the second bending portions. Each lamp fixing portion extends along a Y axis to be a strip. The lamp fixing portions are spaced apart from each other and arranged in a column along an X axis that is perpendicular to the Y axis. Both the first bending portion and each second bending portion extend from the lamp fixing portions toward away from the lamps.

In the present disclosure, the transparent display screen is provided with the lamps and the IC components on a flexible circuit board, and no connector is used, reducing a cost of the transparent display screen and simplifying a making process.

BRIEF DESCRIPTION OF THE DRAWINGS

Implementations of the present technology will now be described, by way of embodiments only, with reference to the attached figures.

DETAILED DESCRIPTION

Figure 1:
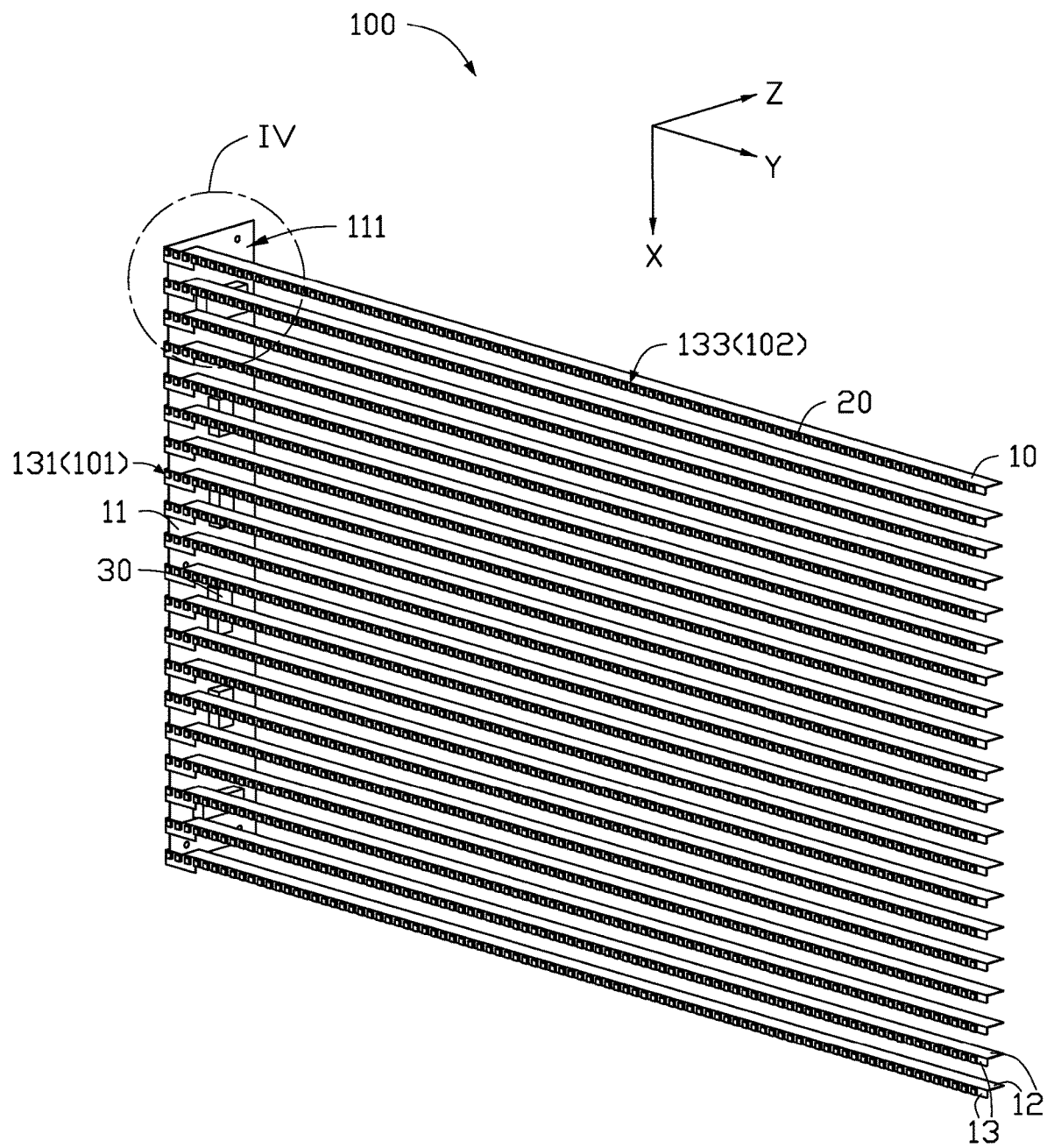
FIG. 1 is an isometric view of a transparent display device in accordance with an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

FIG. 1 illustrates a transparent display device 100 according to an embodiment. The transparent display device 100 includes a flexible circuit board 10, a plurality of lamps 20, and a plurality of integrated circuit (IC) components 30 on the flexible circuit board 10. The lamps 20 and the IC components 30 are located on different surfaces of the flexible circuit board 10.

Figure 2:
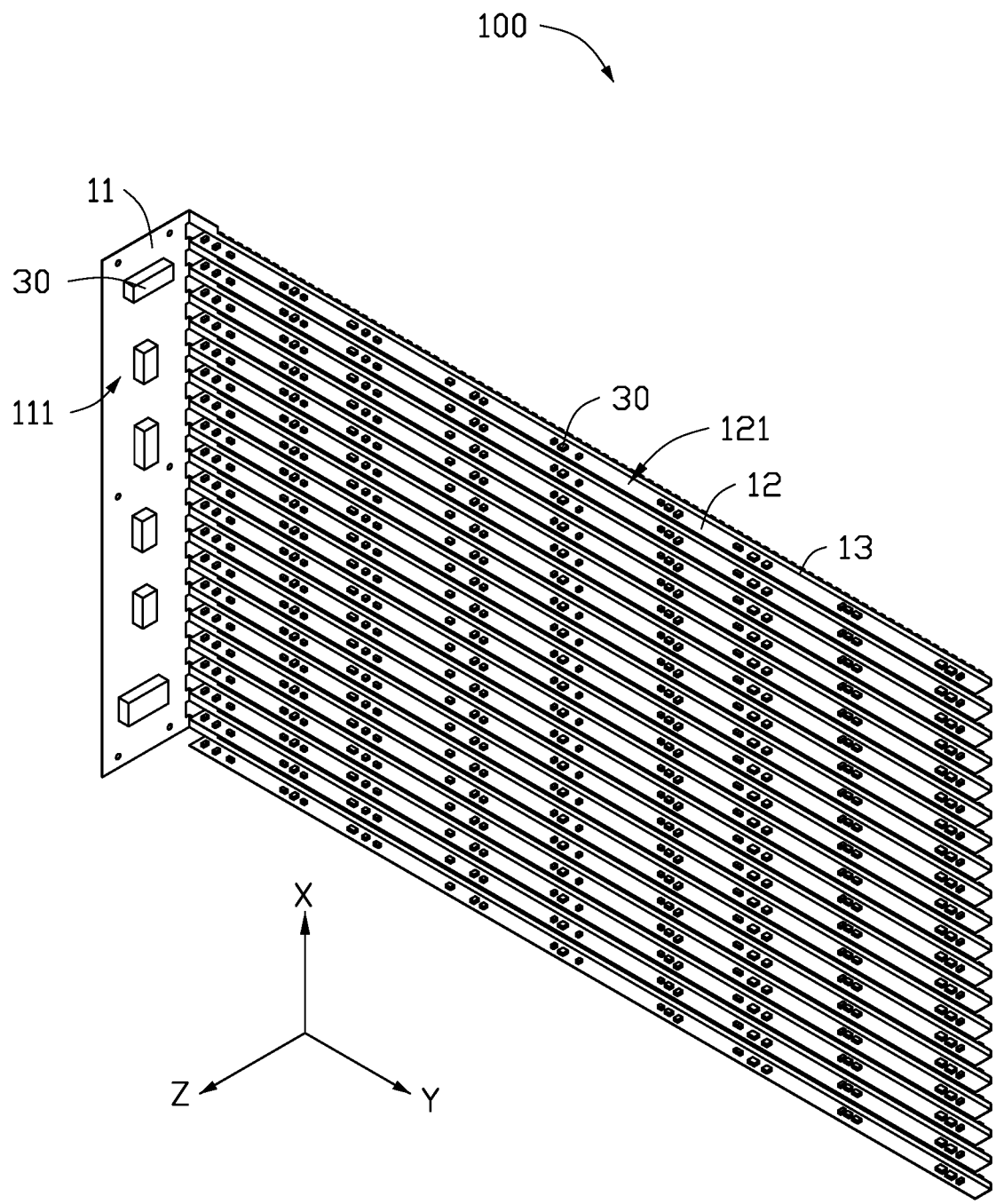
FIG. 2 is another isometric view of the transparent display device of FIG. 1 viewed from other angle.

Referring to both FIG. 1 and FIG. 2, the flexible circuit board 10 includes a plurality of lamp fixing portions 13, a first bending portion 11, and a plurality of second bending portions 12. The lamps 20 are mounted on the lamp fixing portions 13, and the IC components 30 are mounted on both the first bending portion 11 and the second bending portions 12.

FIG. 1 shows an X axis, a Y axis, and a Z axis perpendicular to each other. Each lamp fixing portion 13 extends as a strip along the Y axis. The lamp fixing portions 13 are spaced apart from each other and arranged in a column along the X axis. A portion of the lamps 20 is arranged on each lamp fixing portion 13. The lamps 20 on each lamp fixing portion 13 are spaced apart from each other and arranged in a row along the Y axis. Thus, the lamps 20 on all of the lamp fixing portions 13 are arranged in an array, in rows along the Y axis and in columns along the X axis. In this embodiment, the flexible circuit board 10 includes twenty lamp fixing portions 13, and tens of lamps 20 are provided on each lamp fixing portion 13. The surfaces of the lamp fixing portions 13 carrying the lamps 20 define a front surface of the transparent display device 100. In the present embodiment, each lamp 20 may be a full-color LED. In other embodiments, each lamp 20 may be a single-color or dual-color LED.

Each lamp fixing portion 13 has an end edge 131 along the X axis and a side edge 133 along the Y axis. The end edge 131 is coupled to the side edge 133 and the end edge 131 is much shorter than the side edge 133. As shown in FIG. 1, the first bending portion 11 is coupled to the end edges 131 of the lamp fixing portions 13. A number of the second bending portions 12 is equal to a number of the lamp fixing portions 13. Each second bending portion 12 is coupled to one lamp fixing portion 13, specifically being coupled to the side edge 133 of one lamp fixing portion 13. Each second bending portion 12 extends as a strip along the Y axis. The second bending portions 12 are spaced apart from each other and arranged in a column along the X axis.

As shown in FIG. 1, each lamp fixing portion 13 is on a plane defined by the X axis and the Y axis. The first bending portion 11 is on a plane defined by the X axis and the Z axis and each second bending portion 12 is on a plane defined by the Y axis and the Z axis.

Figure 3:
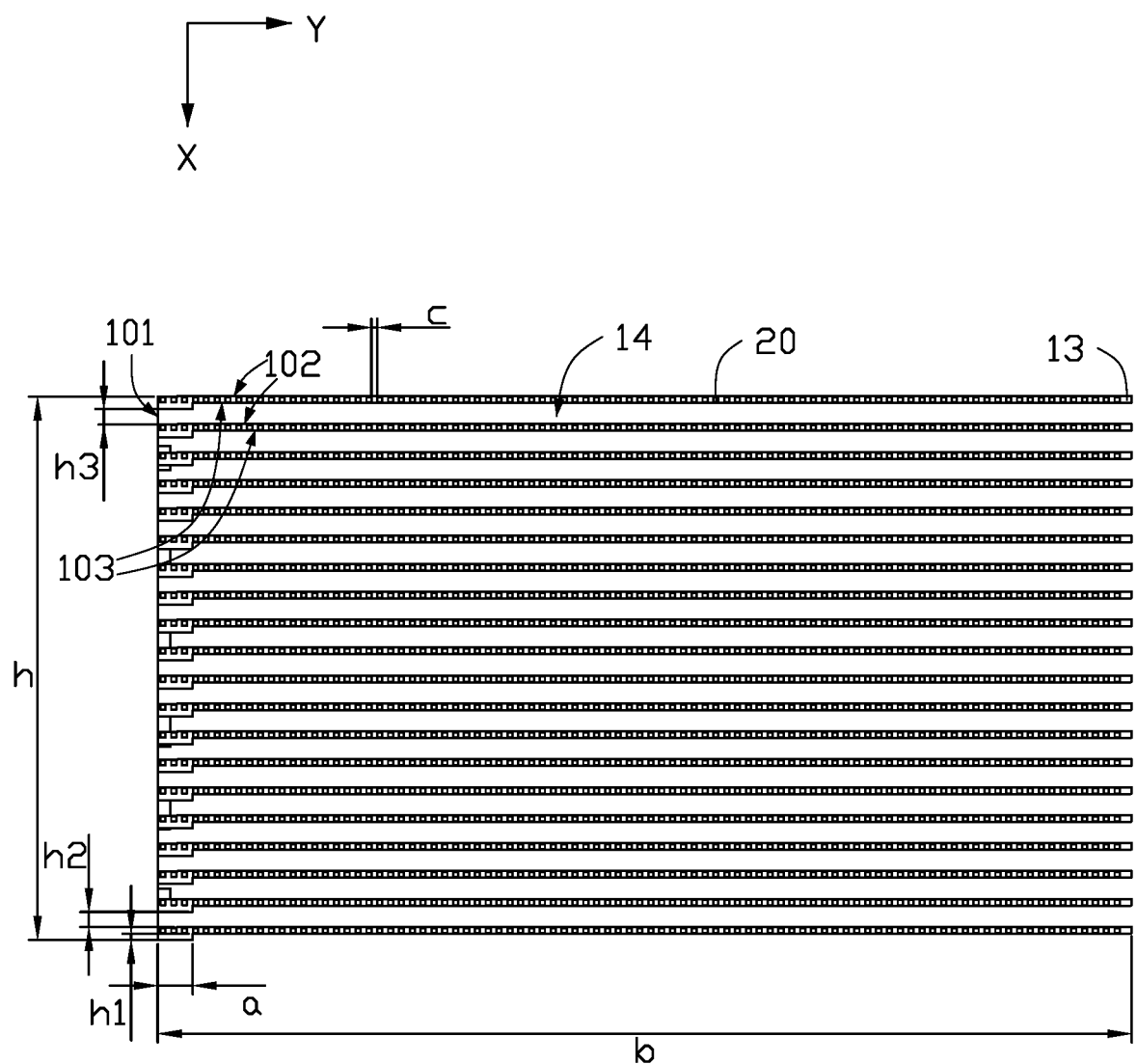
FIG. 3 is a plan view of the transparent display device of FIG. 1.
Figure 4:
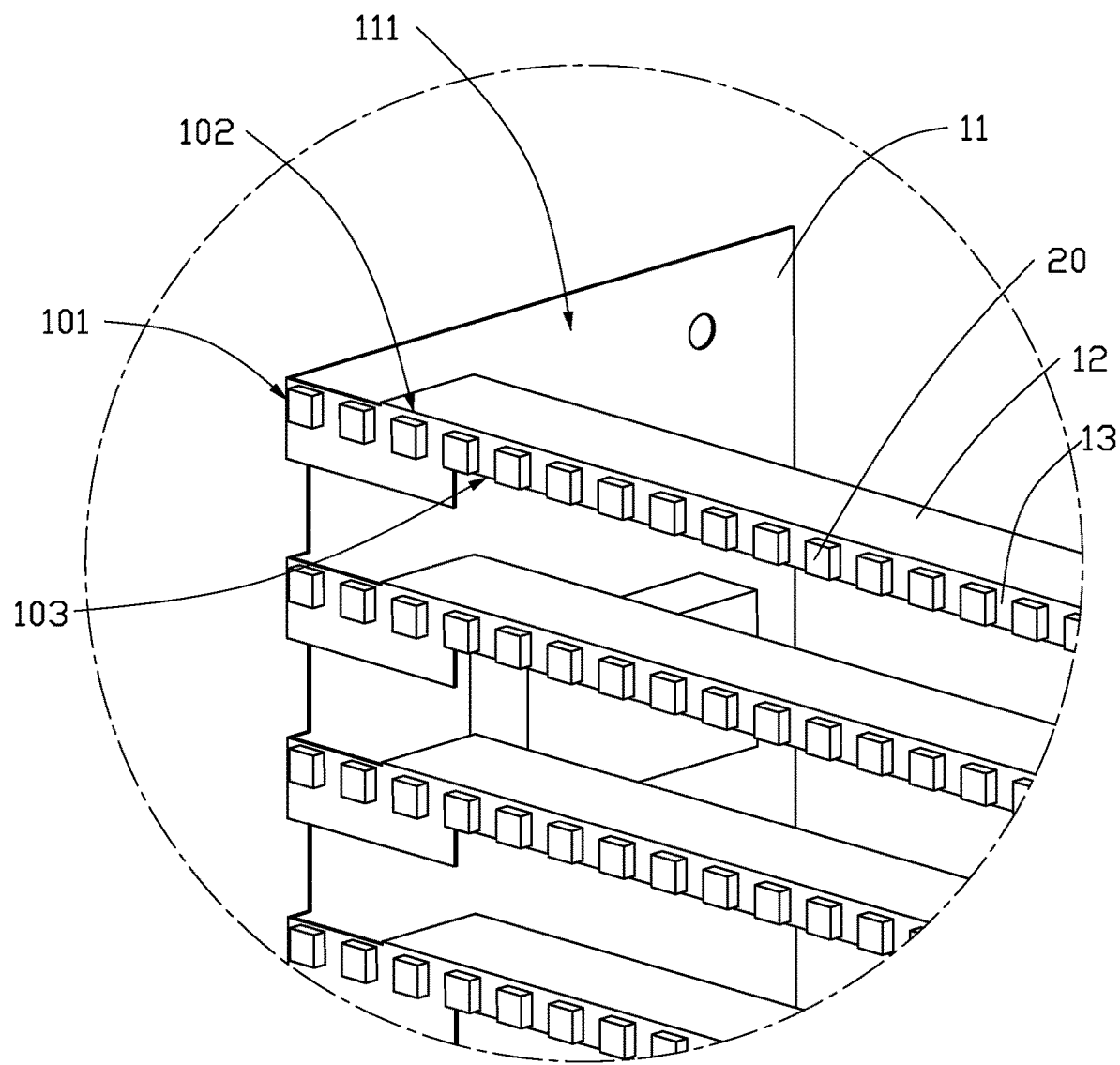
FIG. 4 is an enlarged view of an area of the transparent display device within a circle IV of FIG. 1.

The lamp fixing portions 13, the first bending portion 11, and the second bending portions 12 are defined by bending and cutting the flexible circuit board 10. As shown in FIG. 1 and FIG. 3, the flexible circuit board 10 defines a first bending line 101, a plurality of second bending lines 102, and a plurality of cutting lines 103. The first bending line 101 is the end edge 131 extending along the X axis. Each second bending line 102 is the side edge 133 of one lamp fixing portion 13 and the side edges 133 extends along the Y axis. Each cutting line 103 is on a side of one lamp fixing portion 13 away from the second bending portion 12 and the cutting lines 103 extend along the Y axis. A flexible circuit board 10, which is initially flat, is bent along the first bending line 101 to form the first bending portion 11; and other portion of the flexible circuit board 10 excluding the first bending portion 11 are cut along the cutting lines 103 and bent along the second bending lines 102 to form the lamp fixing portions 13 and the second bending portions 12 having one-to-one coupling relationship. As shown in FIG. 4, each cutting line 103 and one adjacent second bending line 102 define one lamp fixing portion 13. Each cutting line 103 and the other adjacent second bending line 102 are spaced apart from each other to form a gap 14 between adjacent two lamp fixing portions 13.

The first bending portion 11 and the second bending portion 12 extend from the lamp fixing portions 13 away from the lamps 20, and do not block light from the lamps 20. In the present embodiment, the first bending portion 11 is perpendicularly coupled to the lamp fixing portions 13 and each second bending portion 12 is perpendicularly coupled to one of the lamp fixing portions 13. The angle of bending between the first bending portion 11 and the lamp fixing portions 13 and the bending angle between each second bending portion 12 and the lamp fixing portions 13 is not limited to 90 degrees and can be other angles, such as 80 degrees, or 100 degrees.

In the present embodiment, there is only one first bending portion 11. In other embodiment, there may be two first bending portions 11 coupling to opposite end edges of the lamp fixing portion 13.

As shown in FIG. 1 and FIG. 2, some IC components 30 are mounted on a surface 111 of the first bending portion 11 adjacent to the second bending portions 12. Some other IC components 30 are mounted on the second bending portions 12, especially on a surface 121 of the second bending portions 12 away from the lamps 20. As shown in FIG. 3, when the transparent display device 100 is viewed from the front, the lamp fixing portions 13 shield the IC components 30 on the second bending portions 12 and the first bending portion 11, thereby the IC components 30 on the first bending portion 11 and the second bending portions 12 do not obstruct the light transmittance.

In the present embodiment, the IC components 30 on the second bending portions 12 are electrically coupled to the lamps 20 and control light emission from the lamps 20. The IC components 30 on the first bending portion 11 control the IC components 30 on the second bending portions 12.

In the present embodiment, the lamps 20 and the IC components 30 are located on one single flexible circuit board 10. No connector is needed, thus the processing of the transparent display device 100 is simplified and the processing cost of the transparent display device 100 can be reduced.

As shown in FIG. 1 and FIG. 4, in order to enhance connections between the lamp fixing portion 13 and the first bending portion 11, a width of a portion of each lamp fixing portion 13 adjacent to the first bending portion 11 is greater than a width of a remaining portion of each lamp fixing portion 13. In the present embodiment, the widths of each lamp fixing portion 13 are measured in the X axis.

As shown in FIG. 1 and FIG. 4, each first bending portion 11 is spaced apart from each second bending portion 12. A length of each lamp fixing portion 13 is greater than a length of each second bending portion 12. In the present embodiment, the lengths of each lamp fixing portion 13 are along the Y axis.

A light transmittance of the transparent display device 100 is a very important parameter. FIG. 3 shows that the light transmittance of the transparent display device 100 has a relationship between a ratio of a total area of the gaps 14 to an area of the front surface. The light transmittance of a conventional transparent display device is about 65%. In the present embodiment, a length b of the lamp fixing portion 13 is 404.2 mm, and a width h of the lamp fixing portions 13 is 225.8 mm. Total display area is 225.8 mm*404.2 mm=91268.36 mm$^2$. A total area of the gaps 14 is 2.6*389.7*20+6.4*404.2*19=69415.12 mm$^2$. Therefore, the light transmittance of the transparent display device 100 in the present embodiment is 69415.12/912.68.36=76.05%, about 10% higher than that of the conventional transparent display device. A difference h1 of the width of the portion of the lamp fixing portion 13 adjacent to the first bending portion 11 and the width of the other portions of the lamp fixing portion 13 is 2.6 mm. The length a of the wider portion of the lamp fixing portion 13 is 14.5 mm, and distance h2 between the wider portion of the lamp fixing portion 13 and the adjacent lamp fixing part 13 is 6.4 mm. Distance c between adjacent lamps 20 in the Y axis is 4.5 mm, and distance h3 between adjacent lamps 20 in the X axis is 11.6 mm. The distance between adjacent lamps 20 can be adjusted as required.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A transparent display device, comprising:
    a flexible circuit board, the flexible circuit board comprising a plurality of lamp fixing portions, a first bending portion coupling to the plurality of lamp fixing portions, and a plurality of second bending portions each coupling to a corresponding one of the plurality of lamp fixing portions;

a plurality of lamps on the plurality of lamp fixing portions;

a plurality of integrated circuit (IC) components on the first bending portion and the plurality of second bending portions;

wherein each of the plurality of lamp fixing portions extends as a strip along a Y axis; the plurality of lamp fixing portions are spaced apart from each other and arranged in a column along an X axis that is perpendicular to the Y axis; each of the plurality of lamp fixing portions comprises an end edge along the X axis and a side edge along the Y axis; the end edge is coupled to the side edge; the first bending portion is bent from the end edge of each of the plurality of lamp fixing portions; each of the plurality of second bending portions is bent from the side edge of one of the plurality of lamp fixing portions.

2. The transparent display device of claim 1, wherein the plurality of lamps are spaced apart from each other and arranged in an array of columns along the X axis and rows along the Y axis, each of the rows of lamps are located on a corresponding one of the plurality of lamp fixing portions.

3. The transparent display device of claim 2, wherein both the first bending portion and each of the plurality of second bending portions extend from the plurality of lamp fixing portions toward away from the plurality of lamps.

4. The transparent display device of claim 3, wherein a portion of the plurality of IC components are mounted on a surface of the first bending portion adjacent to the second bending portions.

5. The transparent display device of claim 3, wherein a portion of the plurality of IC components are mounted on a surface of each of the plurality of the second bending portions away from the plurality of lamps.

6. The transparent display device of claim 1, wherein the first bending portion is perpendicularly coupled to each of the plurality of lamp fixing portions.

7. The transparent display device of claim 1, wherein each of the plurality of second bending portions is perpendicularly coupled to one of the plurality of the lamp fixing portions.

8. The transparent display device of claim 1, wherein the first bending portion is spaced apart from each of the plurality of second bending portions; a length of each of the plurality of lamp fixing portions along the Y axis is greater than a length of each of the plurality of second bending portions along the Y axis.

9. The transparent display device of claim 1, wherein a width of a portion of each of the plurality of lamp fixing portions adjacent to the first bending portion is greater than a width of a remaining portion of each of the plurality of lamp fixing portions; the width of each of the plurality of lamp fixing portions is measured in the X axis.

10. The transparent display device of claim 1, wherein each of the plurality of lamps is a light emitting diode.

11. A transparent display device, comprising:
a flexible circuit board, the flexible circuit board comprising a plurality of lamp fixing portions, a first bending portion coupling to the plurality of lamp fixing portions, and a plurality of second bending portions each coupling to a corresponding one of the plurality of lamp fixing portions;

a plurality of lamps on the plurality of lamp fixing portions, the plurality of lamps being spaced apart from each other and arranged in an array;

a plurality of integrated circuit (IC) components on the first bending portion and the plurality of second bending portions;

wherein each of the plurality of lamp fixing portions extends along a Y axis to be a strip; the plurality of lamp fixing portions are spaced apart from each other and arranged in a column along an X axis that is perpendicular to the Y axis; and wherein both the first bending portion and each of the plurality of second bending portions extend from the plurality of lamp fixing portions toward away from the plurality of lamps.

12. The transparent display device of claim 11, wherein each of the plurality of lamp fixing portions comprises an end edge along the X axis and a side edge along the Y axis; the end edge is coupled to the side edge; the first bending portion is bent from the end edge of each of the plurality of lamp fixing portions; each of the plurality of second bending portions is bent from the side edge of one of the plurality of lamp fixing portions.

13. The transparent display device of claim 11, wherein a portion of the plurality of IC components are mounted on a surface of the first bending portion adjacent to the second bending portions.

14. The transparent display device of claim 11, wherein a portion of the plurality of IC components are mounted on a surface of each of the plurality of the second bending portions away from the plurality of lamps.

15. The transparent display device of claim 11, wherein the first bending portion is perpendicularly coupled to each of the plurality of lamp fixing portions; each of the plurality of second bending portions is perpendicularly coupled to one of the plurality of the lamp fixing portions.

16. The transparent display device of claim 11, wherein the first bending portion is spaced apart from each of the plurality of second bending portions; a length of each of the plurality of lamp fixing portions along the Y axis is greater than a length of each of the plurality of second bending portions along the Y axis.

17. The transparent display device of claim 11, wherein a width of a portion of each of the plurality of lamp fixing portions adjacent to the first bending portion is greater than a width of a remaining portion of each of the plurality of lamp fixing portions; the width of each of the plurality of lamp fixing portions is measured in the X axis.

* * * * *